United States Patent [19]

Bellavance

[11] 4,114,257
[45] Sep. 19, 1978

[54] METHOD OF FABRICATION OF A MONOLITHIC INTEGRATED OPTICAL CIRCUIT

[75] Inventor: David Walter Bellavance, Dallas, Tex.

[73] Assignee: Texas Instruments Incorporated, Dallas, Tex.

[21] Appl. No.: 726,092

[22] Filed: Sep. 23, 1976

[51] Int. Cl.² .............................................. B01J 17/00
[52] U.S. Cl. ........................................ 29/572; 29/578; 29/577 R; 350/96.30
[58] Field of Search ............... 29/577, 578, 572; 148/175; 350/96 WG

[56] References Cited

U.S. PATENT DOCUMENTS

| | | | |
|---|---|---|---|
| 3,900,863 | 8/1975 | Kim | 148/175 |
| 3,902,133 | 8/1975 | Watts | 350/96 WG |
| 3,948,583 | 4/1976 | Tien | 350/96 WG |
| 3,984,173 | 10/1976 | Shaw | 350/96 WG |

*Primary Examiner*—W. Tupman
*Attorney, Agent, or Firm*—James T. Comfort; Rene' E. Grossman; Stephen B. Goldman

[57] ABSTRACT

A method for fabricating a three-dimensional integrated optical circuit is disclosed. Selective liquid phase epitaxy is utilized to grow active electro-optic devices consisting of an I-bar mesa laser, a directional-coupler switch and a channel-waveguide modulator, and a passive electro-optic device consisting of a directional-coupler wherein all devices in the integrated optical circuit as grown on the substrate are interconnected by means of a three-dimensional waveguide structure. The active and passive device section of the substrate consists of an open area to allow for the selective epitaxial growth of an I-bar mesa laser or the formation of a metallized pattern in the fabrication of directional-coupler switches, channel-waveguide modulators and directional-couplers. Theses devices are interconnected by means of an optical waveguide structure which may have the form of a single or double heterojunction structure of the ridge waveguide type. By optionally embedding the single heterojunction waveguide structure with an optical material having a lower effective retractive index, lower loss of the transmitted light signal by the waveguide structure is achieved. Optical fiber structures may be connected to the end of the optical waveguide structures by several means, for example, of butting the fiber ends against a respectively fabricated I-bar end.

3 Claims, 9 Drawing Figures

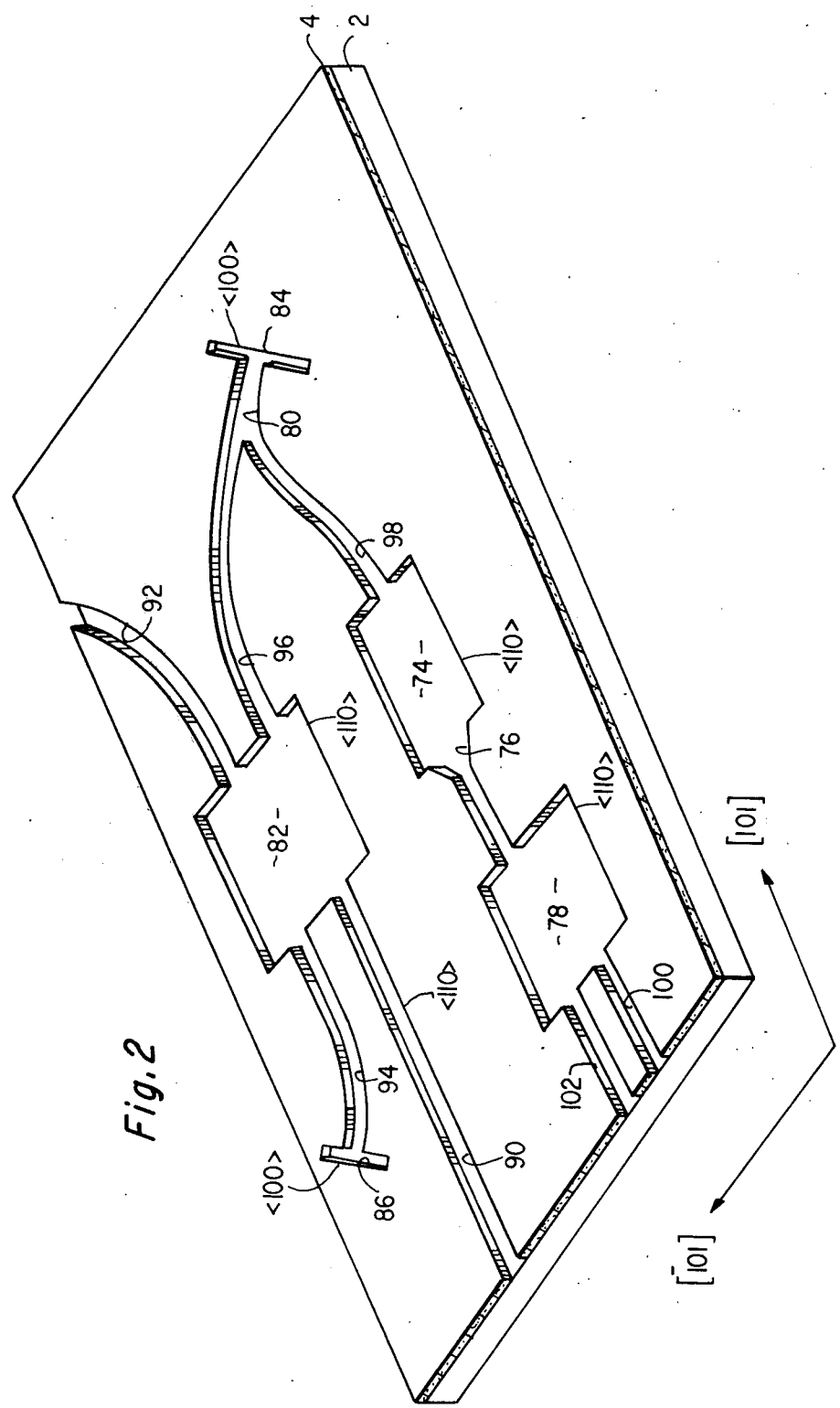

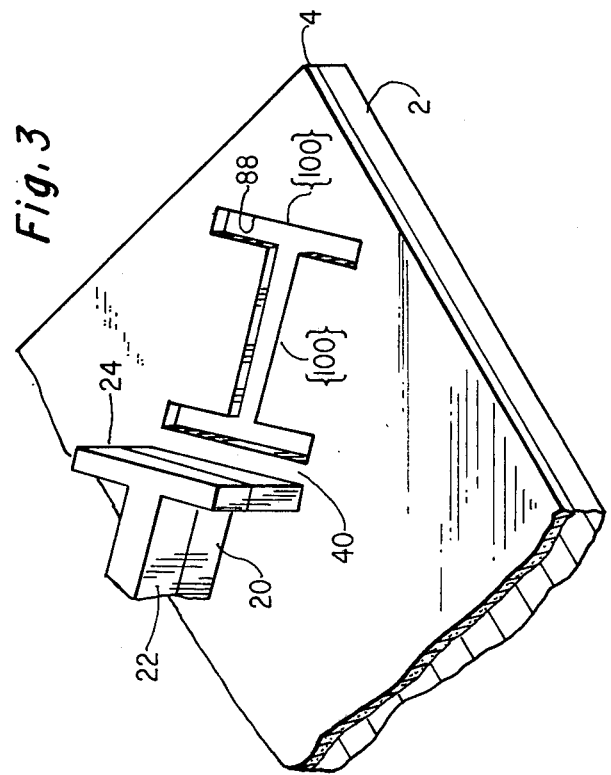
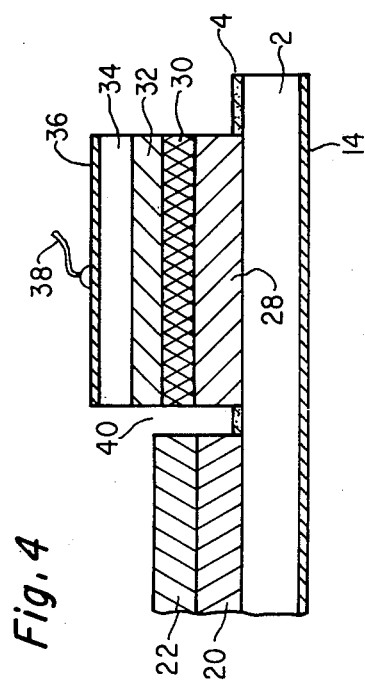
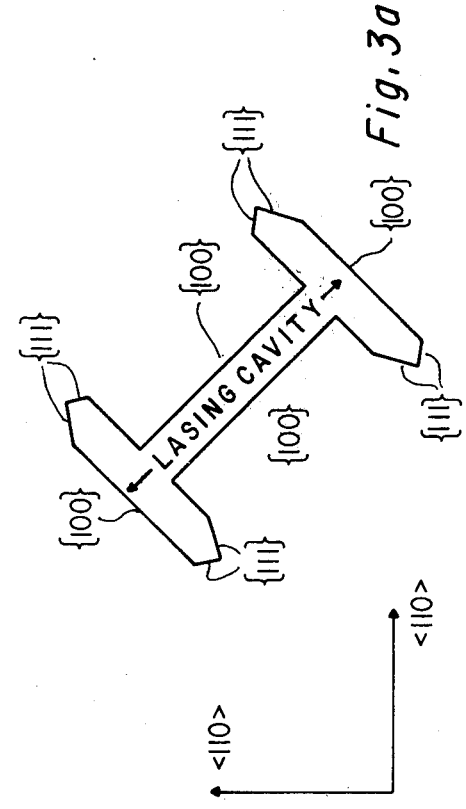

METHOD OF FABRICATION OF A MONOLITHIC INTEGRATED OPTICAL CIRCUIT

This invention relates to integrated optical systems and more particularly to a method of fabricating a three-dimensional monolithic integrated optical circuit having two-dimensional confinement.

In the transmission of large volumes of information, it is advantageous to employ a carrier frequency as high as possible to achieve the greatest possible band width and therefore the highest possible transmission rate. Consequently, high data rate transmission is best accomplished with carrier frequencies in the optical region. Significant applications include connecting computer-to-computer and computer-to-interactive display terminals, both on-side and over long-lines, loop-type information links interconnecting interactive terminals with full capability for multi-TV, on-site or intersite real time production line monitoring, video conferences, and information management of integrated avionic systems, shipboard communication loops, and army command vans. Pictorial information, for example X-ray and thermoscope pictures, and real-time TV, are easily accomplished. The developing need for an improved communications technology associated with urban improvement, for example, "new towns" where 30 equivalent TV channels in both directions connecting every home is envisioned, can be accomplished by a single optical communications link.

As improved sources and associated devices have been and continue to be developed, the feasibility of optical data processing systems is becoming an acceptable premise. In this connection, the integration of optical devices in a manner similar to the well-known integrated circuit may enable multiple data processing functions to be performed on a small area of material, provided the necessary miniaturization of the optical components in integration of the separate functions can be achieved. In general, integrated optics would include, for example, a source for light generation, propagation, modulation, and directional coupling, wherein all these functions are integrated so as to take place on a single substrate.

The concept of integrated optics encompasses many areas, for example, the use of microwave techniques at optical frequencies to perform such functions as transmissions, modulation, switching and mixing. Various optical and electro-optical techniques are brought together to achieve these functions. Integrated optics involve miniaturization of components such as lasers, modulators, detectors, and switches. Finally, active systems require monolithic integration of the different optical functions on the same semiconductor substrate.

A key element in an integrated optical circuit is the optical waveguide that confines the propagation of light not only in straight lines, but also around bends, and at relatively low losses. In integrated optical circuits requiring complex processing of information, it will be necessary to utilize bends, curves, and dividers in the waveguide section. Presently known two-dimensional confinement waveguides are based on having a region of higher index of refraction surrounded by lower effective index media to confine and propagate the light between active components of the proposed integrated optical circuit.

Dielectric optical waveguides and a method for fabricating the same by vapor phase epitaxy for straight configurations have been taught to us by D. W. Shaw, co-pending U.S. patent application Ser. No. 458,628, filed Apr. 8, 1974, U.S. Pat. No. 3,984,173 assigned to Texas Instruments Incorporated, the same assignee of this patent application. In accordance with the teachings of D.W. Shaw, the straight optical waveguides comprise layers of semiconductor material of the same conductivity type, wherein one of the semiconductor layers has a relatively high refractive index, while the other semiconductor layers have a relatively low refractive index with the light being propagated in the semiconductor layer having the relatively higher refractive index. The substrate is a semiconductor material crystallographically oriented to expose a surface parallel to a relatively fast growing plane for subsequent vapor phase epitaxial growth.

The dielectric mask opening is oriented on the planar surface of the substrate material in such a manner that the sides and end walls of the opening in the dielectric mask will be oriented to lie in planes parallel to the slow growing crystallographic planes of the semiconductor substrate. The preferred orientation of the dielectric mask opening to the crystallographic planes of the substrate allows for the formation of an optical waveguide wherein each of its four planar surfaces including top, bottom, and side surfaces are formed as smooth, planar faceted growth surfaces.

A method of growing dielectric optical waveguides of arcuate structure preferentially by selective liquid phase epitaxy has been taught to us by D. W. Bellavance, co-pending U.S. patent application Ser. No. 709,554, filed July 29, 1976, assigned to Texas Instruments Incorporated, the same assignee of this patent application. This disclosure describes optical waveguides of arcuate structure having nonfaceted sidewalls in which the lateral discontinuity in the index of refraction is relatively large, and the resulting confinement is superior to the conventional rib waveguide and dielectric strip waveguide structures. The arcuate epitaxially grown waveguide structure comprises a substrate of semiconductor material having a planarized surface; at least one arcuate semiconductor structure having a low index of refraction as an optical barrier layer; an an arcuate semiconductor structure having a high index of refraction as a light-guiding region.

For a relatively low radius of curvature where $r_c = $ 10 mils, the angle is dominated by a sharp facet, with the faceting slowly decreasing as the radius of curvature increases, until at $r_c = $ 25 miles, substantially smooth sides are formed around the bend of the optical waveguide. Accordingly, Bellavance provides optical waveguides of bends, curves, and dividers providing for low loss propagation of light between active components of a proposed integrated optical circuit. All of the structures have been grown using the conventional horizontal graphite boat with sliding compartment technique.

Integrated optical circuits will require a monolithic injection laser source wich can be readily fabricated insitu in the integrated optical circuit and will operate cw at room temperature. A new monolithic mesa laser structure grown by selective liquid phase epitaxy through openings in a silicon nitride mask has been taught to us by D. W. Bellavance, co-pending U.S. patent application Ser. No. 645,773, filed Dec. 31, 1975, assigned to Texas Instruments Incorporated, the same assignee of this patent application. In accordance with Bellavance, a semiconductor I-bar mesa laser is fabricated having an elongated central member and cross bars at each end of and perpendicular to the axis of the elongated central member, the axis of the elongated central member being oriented in a <100> direction. The semiconductor mesa has crystallographic facets perpendicular to the substrate and parallel to one another, wherein the crystallographic facets form the reflecting mirrors of the lasting cavity. The I-bar mesa laser is epitaxially grown from Group III-V semiconductor material.

Optical modulation is the process by which information is put on a lightwave. Monolithic high speed channel waveguide optical modulators are needed for the development of integrated optical circuits. An electro-optic modulator is disclosed in "GaAs Electro-Optic Channel Waveguide Modulator", J. C. Campbell, F. A. Blum, and D. W. Shaw, *Applied Physics Letters*, Vol. 26, No. 11, June 1, 1975. Accordingly, a high speed GaAs channel waveguide modulator utilizes the electro-optic effect to (i) confine light in the vicinity of a narrow Schottky barrier strip and/or to (ii) modulate the trapped beam.

A lightly doped GaAs epitaxial layer is grown on a heavily doped GaAs substrate by vapor phase epitaxy. This structure forms a planar asymmetric waveguide upon which a Schottky barrier is fabricated by opening a narrow strip in an oxide mask using standard photoresist techniques and then selectively electroplating a Pt contact. When the Schottky barrier strip is reverse biased, much of the light coupled into the waveguide is trapped under the metal contact because of the electrooptic contribution to the refractive index in that region. The electrooptic channel waveguide permits the beam trapping to be controlled by the applied voltage. If this voltage is modulated, the signals seen by a small aperture receiver such as an optical fiber is amplitude modulated.

Another important device which has found utility in the integrated optical circuit is the electro-optic directional coupler switch. A switch of this character has been disclosed in "GaAs ElectroOptic Directional Coupler Switch", J. C. Campbell, F. A. Blum, D. W. Shaw, and K. L. Lawley, *Applied Physics Letters*, Vol. 27, No. 4, Aug. 15, 1975. This device consists of two parallel metal-gap optical stripeline waveguides forming a passive directional coupler with an electro-optic pad at the edge of each waveguide. Additionally, light is focused into one of the waveguides, and the amount of light coupled to the adjacent channel can be controlled electro-optically. This not only permits direct amplitude modulation of the light propagating in one channel but allows light to be switched from one channel to the other.

A planar asymmetric waveguide is formed by growing a lightly doped GaAs epitaxial layer on a heavily doped GaAs substrate by vapor phase epitaxy. The structure is fabricated into a metal-gap optical stripline by patterning narrow strips on top of the epitaxial layer using standard photoresist and etching techniques. The epitaxial layer surface is then clad by selectively electroplating Pt Schottky barrier contacts. In the absence of an applied electric field, the propagation constants of the two waveguides are equal, and the power coupled from the input waveguide to the adjacent channel varies sinusoidally with the length of the coupler. Switching is achieved by applying an electric field to one of the waveguides. This spoils the phase synchronism between the two channels, thus reducing the coupling and causing all the light to emerge from the input channel.

As has been indicated by the references cited above, techniques for the fabrication of the various electro-optic devices required for an integrated optical circuit are known. However, the objective now is to integrate these electro-optic devices and couple the circuit outputs to fiber optic cables. In particular, a method for fabricating a three-dimensional monolithic integrated optical circuit is being sought.

Recently, a few fabricating techniques for integrating discrete optical waveguide components have been reported. A variety of these techniques have been reported in "Moving Toward Integrated Optics", Elsa Garmire, *Laser Focus*, October, 1975. In one technique described, light is coupled into successive layers, each of which performs a different optical function. Light can be coupled through successive planes by a taper or evanescent field coupling. By growing successive layers with different doping concentrations and by selectively growing or etching tapers to couple light into the appropriate layers, monolithic optical devices can be fabricated from uniform planar layers, using only etching and diffusion techniques.

In another technique, integration is based on the coupling of light between areas of different compositions in the same plane. Planar optical waveguides are separated into various active regions by isolation techniques such as proton bombardment or by selectively etching part of the waveguide followed by vapor phase epitaxial regrowth.

An alternative integration method requires optical confinement in two dimensions, with the light propagated in confined circuits in the waveguide plane. Although waveguide components using two-dimensional confinement have been developed, no two-dimensional confinement integrated optical circuits have been reported.

A monolithic structure containing a laser and a waveguide coupled by evanescent field coupling has been taught to us by R. K. Watts, U.S. Pat. No. 3,902,133, issued Aug. 26, 1975, assigned to Texas Instruments Incorporated, the same assignee of this patent application. To accomplish this, a large optical cavity injection laser including internal layers forming the optical cavity, to which the radiation is confined because of index of refraction discontinuities, is provided as a mesa on a substrate wherein the substrate is made of n-type gallium arsenide. An evanescent field coupling exists between the lower layer of the mesa laser structure and the waveguide layer of the substrate.

An integrated optical circuit is disclosed by W. C. Holton, co-pending U.S. patent application Ser. No. 434,469, filed Jan. 18, 1974, assigned to Texas Instruments Incorporated, the same assignee of the present patent application. According to the teachings of Holton, various techniques for the integration of a surface laser and an optical waveguide are disclosed. The various disclosed techniques for coupling between the laser and the waveguide structure include evanescent field coupling by matching the phase velocity of the laser radiation generated in the active surface laser region to that of the optical waveguide structure and grating coupling by means of a grating structure comprising a plurality of grooves formed in the top surface of the active laser layer wherein the active surface laser layer is joined to the optical waveguide.

W. C. Holten describes the concept of the integrated optical circuit as represented by the conceptual FIG. 9 indicated therein. The integrated optical circuit comprises a substrate of semiconductor material which is provided with a surface injection laser for feeding laser radiation to a three-dimensional delineated waveguide defined on he substrate. Modulation and switching of the laser radiation occurs in the depicted waveguide structure and are controlled separately. In this respect, an electro-optic modulator is indicated across the waveguide portion extending from the output of the surface injection laser and is located in advance of a T-branch in the waveguide which extends into two branch waveguide portions. A separate waveguide portion is indicated on the substrate, being located in spaced relation to a branch of the waveguide portion and having at least part of its length in close proximity to said branch of the waveguide. An acousto-optic switch lies astride the proximate portions of the branch waveguide and is operable to switch light radiation from one waveguide portion to the other waveguide portion.

SUMMARY OF THE INVENTION

A method for fabricating a three-dimensional integrated optical circuit having two-dimensional confinement is disclosed. Selective liquid phase epitaxy is utilized to grow active electro-optic devices consisting of an I-bar mesa laser, a directional-coupler switch, and a channel-waveguide modulator, and a passive electro-optic device consisting of a directional-coupler wherein all devices of the integrated optical circuits as grown on the substrate are interconnected by means of a three-dimensional waveguide structure having two-dimensional confinement.

A mask layer is deposited onto the planar surface of a Group III-V semiconductor substrate. A portion of the mask is removed so as to define the locations of active and passive devices and their interconnecting waveguide means. The device sections of the substrate consist of open areas to allow for epitaxial growth herein in the fabrication of the directional-coupler switches, channel-waveguide modulators, and directional-couplers. These active and passive devices are interconnected by means of a three-dimensional optical waveguide structure having two-dimensional confinement which may have the form of a single or double heterojunction structure of the ridged waveguide type. Selective liquid phase epitaxy is employed utilizing semiconductor materials of the Group III-V compounds, having the formula $Ga_{1-x}Al_xAs$; however, selective vapor phase epitaxy is also suitable in growing the waveguide device structure when materials comprising $Ga_{1-x}In_xAs$, $GaAs_{1-x}P_x$, or $Ga_{1-x}In_xAs_{1-y}P_y$ are used. By optionally embedding the single heterojunction waveguide structure with an optical material having a lower effective refractive index, lower loss confinement of the transmitted light signal by the waveguide structure is achieved.

An I-bar mesa laser is fabricated by selective liquid phase epitaxy onto the planar surface of the semiconductor substrate through a patterned opening wherein the laser comprises a Group III-V semi-conductor mesa having an elongated central member and cross bars at each end of and perpendicular to the axis of the elongated central member and the axis of the elongated central member is oriented in a <100> direction. The I-bar mesa laser is coupled to the waveguide structure by means of end firing.

The semiconductor active and passive optical devices are fabricated by means of selectively electroplating Schottky barrier strips onto the semiconductor structure comprising the device.

Optical fibers may be connected to the end of the optical waveguide structures by means, for example, of butting the optical fiber against a cleaved end of a waveguide structure or against a fabricated I-bar end. The I-bar end waveguide structure comprises a semiconductor mesa having an elongated central member and a cross bar thereon at one end of and perpendicular to the axis of the elongated central member.

Accordingly, an object of the present invention is to provide a method for interconnecting active and passive devices of an integrated optical circuit on a semiconductor substrate.

Another object of the present invention is to provide a method for fabricating a three-dimensional monolithic integrated optical circuit having two-dimensional confinement.

Yet still another object of the present invention is to provide attachment means for optical fibers to epitaxially grown semiconductor waveguides.

BRIEF DESCRIPTION OF THE DRAWINGS

The invention, together with its various features and advantages, can be easily understood from the following, more detailed description, taken in conjunction with the accompanying drawings in which:

FIG. 2 is a perspective view of a semiconductor substrate having a patterned mask thereon defining the optical waveguides and the active and passive optical devices therein.

FIGS. 3-3A indicates the patterning and orientation of an I-bar mesa laser structure in relationship to an I-bar end semiconductor waveguide structure.

FIG. 4 is a cross-section of an I-bar mesa laser end fired into an optical waveguide.

DETAILED DESCRIPTION

Selective liquid phase epitaxy is used to fabricate various active and passive optical devices in a three-dimensional integrated optical circuit having two-dimensional confinement and to unite all the elements in the circuit by means of a waveguide structure. The common interconnecting bond is the waveguide structure itself. The concept comprises defining two types of areas: (1) those where active and passive devices will be fabricated and (2) interconnecting waveguide networks. The device area comprises a planar open area where the active and passive optical devices may be fabricated. The waveguide structure would interconnect these active and passive areas and would be in the form of a two-dimensional confinement ridge waveguide.

Figure 1:
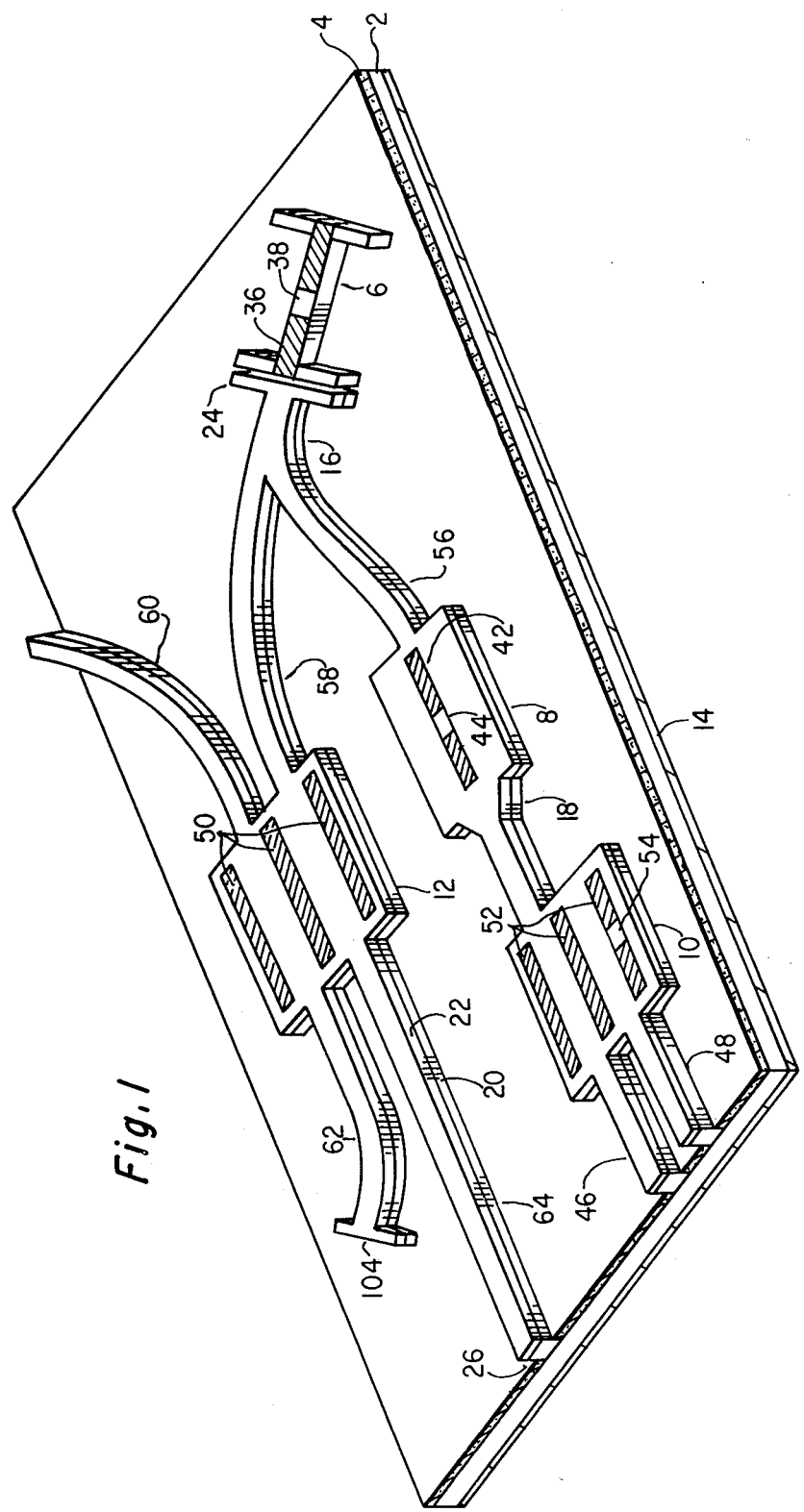
FIG. 1 is a perspective view of a three-dimensional monolithic integrated optical circuit having two-dimensional confinement comprising active and passive optical devices grown thereon.

Referring now to FIG. 1, an epitaxially grown three-dimensional monolithic integrated optical circuit having two-dimensional confinement is shown. In one embodiment of an integrated optical circuit as shown in FIG. 1, an I-bar mesa laser 6 havig a metallized contact surface 36 and a contact pad 38 is fabricated so as to end fire an optical waveguide divider 16 by means of end firing into the vertical face of the I-bar end waveguide structure 24. Light is propagated into the two branches 56 and 58, respectively, of the divider 16.

In one branch 56 of the waveguide divider, light is propagated thereby into an electro-optic channel-waveguide modulator 8, having a Schottky barrier 42 disposed thereon and a contact pad 44. Light operably associated with this active device is modulated by applying a reverse bias to the Schottky barrier. If this voltage is modulated, the signal seen by a small aperture receiver such as the funnel waveguide 18 is amplitude modulated. The modulated light is propagated into a straight channel waveguide section by means of the funneled waveguide section 18. This straight channeled waveguide section integrates the modulator with the electro-optic directional-coupler switch 10. The switch 10 has defined thereon Schottky barrier strips 52 and a contact pad 54. By applying an electric field to the electro-optic switch, light being propagated therein is switched into one of the output waveguides 48. Without the application of an electric field, light would be propagated into the output waveguide 46. Optical fibers may continue the propagation of the modulated or switched light by butting the fibers against the cleaved ends of the waveguide structures 46 and 48, respectively.

Light being propagated by the optical waveguide branch 58 of the divider 16 is coupled into a directional-coupler 12, having metallized patterns 50 deposed thereon. Propagated light therein is now coupled by means of the coupler 12 into a curved output optical waveguide structure 62 having an I-bar end optical fiber attachment means 104. By butting an optical fiber against the vertical face of the I-bar end waveguide 104, light may be continued to be propagated to another integrated optical circuit or other systems as desired. In addition, light may be propagated from another source through the curved waveguide structure 60 which couples with the directional-coupler 12. In this respect, light propagated therein would be switched into the straight output waveguide structure 64 having a cleaved end 26, whereby an optical fiber may be attached to continue the propagation of the light from the integrated optical circuit as noted already.

The three-dimensional integrated optical circuit having two-dimensional confinement is fabricated on a semiconductor substrate 2 having a patterned mask 4 deposed thereon and a metallized contact surface 14 thereon. As indicated in one embodiment the optical waveguide comprises a two-layer structure 20 and 22. Layer 20 having a low index of refraction and acting as an optical barrier layer while layer 22 has a high index of refraction and acts as the light propagation means.

The first step in the fabrication of a three-dimensional integrated optical circuit having two-dimensional confinement is to provide a planar semiconductor substrate. The substrate 2 as indicated in FIG. 2 is selected from a Group III–V semiconductor compound such as n-type GaAs and has a surface oriented in a (100) plane. A dielectric insulator mask material 4 is deposited onto the planar surface of the semiconductor substrate 2 by known techniques. The dielectric insulator may comprise compounds such as silicon oxide, silicon nitride and alumina. In this embodiment, silicon nitride was utilized to prevent the growth of a Group III–V semiconductor material other than in the mask opening.

Referring to FIG. 2, the entire three-dimensional integrated optical circuit except the light emitting device is patterned onto the dielectric mask by using standard photolithographic techniques. The integrated optical circuit pattern is opened in the mask to allow for the epitaxial deposition of the waveguide structure into the pattern openings of the mask. The pattern opening comprises the active optical device areas 74, 78, and 82, as well as the optical waveguide areas 76, 80, 90, 92, 94, 96, 98, 100 and 102, including the I-bar end wave-guide areas 84 and 86. As noted, the entire integrated optical circuit boundaries are patterned in one step.

Figure 6:
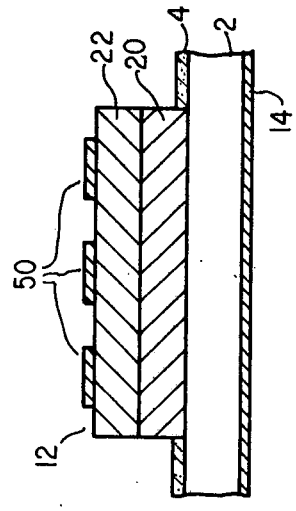
FIG. 6 is a cross-sectional view of an optic directionalcoupler.
Figure 5:
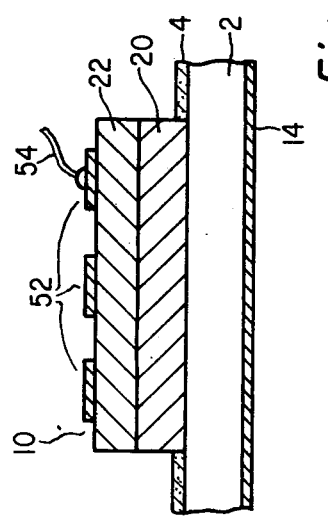
FIG. 5 is a cross-sectional view of an electro-optic directional-coupler switch.
Figure 7:
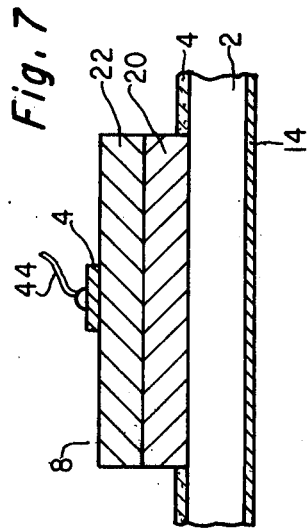
FIG. 7 is a cross-sectional view of an electro-optic channelwaveguide modulator.

Fabrication of the optical waveguides and the active and passive optical devices may be more clearly understood by reference to FIGS. 5–7. The epitaxially grown layers 20 and 22 consist of undoped n-type Group III–V semiconductor materials. Both layers are epitaxially grown preferably by selective liquid phase epitaxy using a conventional horizontal graphite boat with sliding compartment technique. The first expitaxially grown layer 20 is an optical barrier having a low index of refraction whose composition is typically $Ga_{0.85}Al_{0.15}As$. This first layer is grown to a thickness of about 2 microns and covers the width of the entire opening in the dielectric mask which is about 10–25 microns, except for those areas where the active optical devices will be fabricated which are somewhat wider. This first epitaxially grown mesa region will have a top surface which is parallel to the substrate surface and sides comprising smooth crystallographic planes having no faceting in the curved regions. This mesa region will provide a base for the epitaxial growth of the optical waveguide region 22. It is contemplated, however, that selective vapor phase epitaxy is suitable in growing an integrated optical circuit where materials such as $Ga_{1-x}In_xAs$, $GaAs_{1-x}P_x$, or $Ga_{1-x}In_xAs_{1-y}P_y$ are used.

In order to form the optical waveguide region 22, the second epitaxial layer when grown on top of the first epitaxial layer 20, must have a different refractive index. The index of refraction of the light propagation layer must be higher than the bordering layer 20 in order to trap and propagate the light therein. The waveguide region also comprises a Group III–V semiconductor material having a typical composition of $n-Ga_{0.9}Al_{0.1}As$. However, other suitable compositions may also be used with the methods of the present invention as noted above. The optical waveguiding region 22 is now sequentially epitaxially grown on top of the first layer 20 by the technique already mentioned. This layer will be approximately 2 microns in thickness and extend across the total planar surface of the first epitaxially grown layer 20. The top surface of the waveguiding layer will be parallel to the substrate surface and will consist of smooth crystalline growth. The sidewalls of the waveguiding region 22 will, like the first epitaxially grown layer 20, comprise smooth crystallographic planes having no faceting in the curved region.

The arcuate optical waveguides 62, 60, 16, 56 and 58 are grown according to the teachings of D. W. Bellavance in a co-pending U.S. patent application Ser. No. 709,554 as noted above. FIG. 2 shows that arcuate waveguide structures may be grown through the opening of a dielectric mask which is oriented in any selected orientation to the crystallographic planes of the substrate and may also be assembled in any sequence desired. For a radius of curvature of less than 10 mils, the sidewalls of the waveguide structure are dominated by sharp facets; however, at a radius of curvature of about 25 mils, the faceting disappears, and the optical waveguide structure in the curved region comprises smooth sidewalls. The smooth sidewalls decrease the losses one might expect around such bends, by preventing the scattering of light into untrapped modes.

As noted above, straight sections previously have been grown with the long dimension oriented parallel to {100} or a {110} plane. This may be useful for certain device requirements but is not a condition for the growth of this structure. In fact, the arcuate waveguide mask may be oriented across any crystallographic plane of the substrate material to produce the desired results.

The transverse cross section of the epitaxial strips of semi-conductor material included in the optical waveguides constructed in accordance with the present invention may be rectangular. However, the slow crystallographic growth of the side surfaces of an epitaxial strip of semiconductor material may proceed in such a manner as to impart a trapezoidal transverse cross section to the strip, wherein the side surfaces, although formed as smooth faceted growth planar surfaces, are deposed at slight angles from a perpendicular to the top and bottom surfaces of the strip. This structure will also have utility according to the methods of the present invention.

The epitaxially grown optical waveguides now comprise a single heterojunction structure. A double heterojunction waveguide structure may also be grown by the epitaxial growth of an additional layer on epitaxial layer 20. This optionally grown epitaxial layer is similar in composition to the first epitaxial layer 20. This layer will have a lower index of refraction than the waveguide propagating layer 22, as it behaves as an optical barrier like the first layer 20. Again, it may be any suitable n-type $Ga_{1-x}Al_xAs$ material. The thickness of this final barrier layer may be approximately 2 microns.

The difference between the index of refraction of the wave propagation region and the surrounding barrier layers may be quite small. For example, light will be trapped within the propagation region when the difference between the index of refraction is about 0.0005. This difference in the index of refraction of the different waveguide layers is achieved by changing the concentration of aluminum in the respective layers according to the formula $Ga_{1-x}Al_xAs$.

In the fabrication of the active and passive devices the silicon nitride mask layer 4 may be optionally removed by any suitable technique known in prior art. A second dielectric mask layer which may comprise silicon nitride is subsequently deposited over the entire substrate surface including the epitaxially grown waveguide structures by known techniques, such as plasma deposition. The I-bar mesa laser is fabricated according to the technique taught by D. W. Bellavance in a copending U.S. patent application Ser. No. 645,773, as noted above. Referring now to FIGS. 3-3A, this figure shows the shape of the window in the dielectric mask 4 for the fabrication of the I-bar mesa laser and its orientation on the substrate 2 so as to end fire into the optical waveguide by means of the I-bar and waveguide 24. The pattern mask is fabricated such that the central elongated portion of the I-bar mesa laser is perpendicular to the vertical face of the I-bar end waveguide 24. The I-bar mesa laser is positioned a distance 40 from the waveguide end of approximately 5 microns.

The end firing technique may be clearly understood by reference to FIG. 4. The I-bar mesa laser comprises a four-layered structure that is epitaxially grown through the opening in the mask 4 on top of the semiconductor substrate 2. The laser is positioned in such a relationship, so that its lasing cavity 30 will fire coherent optical light into an aligned optical waveguiding layer 22, separated from the laser a small distance 40 of about 5 microns. A method for the fabrication of the I-bar mesa laser may be understood with reference to FIGS. 3A, 4 and 8.

The window of the dielectric mask 4 defines an I-shaped pattern with all of the walls of the window 88 of FIG. 3 oriented in <100> directions so all of the walls are parallel to the {100} crystallographic planes of the substrate. The fabrication is carried out in a liquid phase epitaxy process. The I-bar window is formed as a longitudinal member with cross bars perpendicular to the longitudinal member, while the cross bars being at each end of such longitudinal member. A typical length for the longitudinal member is about 14 to 28 mils while each cross bar is about 3 to 6 mils. The width of the window varies from 5 microns to 25 microns accordingly.

Figure 8:
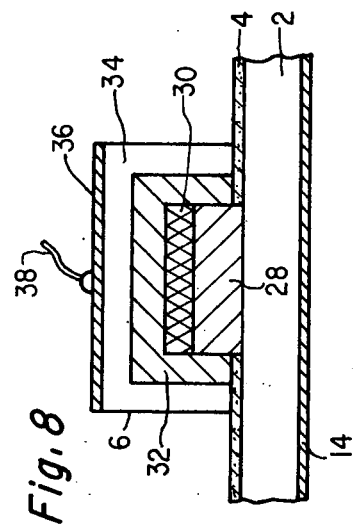
FIG. 8 is a cross-sectional view of an I-bar mesa laser.

Referring to FIG. 8, after the window has been opened according to the pattern shown in FIG. 3, a first n-type gallium aluminum arsenide layer 28 is grown to a specified thickness. A normal thickness is in the order of 2 to 3 microns. Then, the active gallium arsenide layer 30 is grown to a specified thickness such as 1 micron. Following that, the p-type gallium aluminum arsenide layer 32 is grown to a thickness such as 2 microns, and it is followed by growing the p-type gallium arsenide layer 34 to about 1 micron. These dimensions are simply typical examples and can, of course, be modified and changed according to the preferred device characteristics. By fabricating the device using the pattern shown in FIG. 3 by liquid phase epitaxy, the semiconductor laser mesa is grown having a structure as shown in FIGS. 3A and 8. The facets are as shown with the face at each longitudinal end of the mesa having vertical {100} facets perpendicular to the planes of the substrate. At each end of the cross bars of the I-bar, the facets are {111} facets. However, since the lasing occurs between the mirror facets at each end of the longitudinal member, the {111} facets do not interfere with the lasing of the semiconductor laser.

The length of each cross bar must be such that when the laser structure is grown, the {111} facets are removed from the longitudinal axis of the laser structure, and there are vertical {100} facets at the end of the longitudinal axis of the laser structure.

The semiconductor laser has been described with reference to a specific Group III-V compound and Group III-V alloys. The specific Group III-V compound used was gallium arsenide while the specific Group III-V alloy was gallium aluminum arsenide. Other Group III-V materials could be used where Group III is aluminum, gallium, or indium and Group V is phosphorus, arsenic, or antimony. The lasing cavity may be an alloy as well as a compound.

A common contact surface is provided for all of the active optical devices in the integrated optical circuit. This is accomplished by electroplating a tin-gold layer of about 2,000-3,000 angstroms onto the total planar surface of the back side of the semiconductor substrate corresponding to element 14 of FIG. 1. This common contact is employed for use with the I-bar mesa laser and all active devices. In addition, the laser structure must be provided with an additional contact surface. To this end, a mask pattern is provided over the entire central member of the I-bar mesa laser. Optionally, the pattern opening may extend down the vertical face of the longitudinal member and onto the semiconductor substrate 2. A p-type contact is now provided by evaporating a chrome-gold contact into the pattern opening comprising a first layer of about 25 angstroms of chrome and about 500 angstroms of gold. The photoresist is removed in a lift-off technique. As a result of the fact that the top p-gallium arsenide layer surrounds the other layers and extends slightly over the silicon nitride growth mask, large area contacts extending well beyond the 15 micronwide I-bar can be used without shorting to the n-type layers. This facilitates bonding to the laser. An ohmic contact is now provided for by heating the integrated optical circuit at 400° C. for 5 minutes in order to alloy the metallized pattern with the semiconductor material to eliminate the interface resistance.

The last step in the completion of the integrated optical circuit is to fabricate the active and passive optical devices by a metallization technique. Photoresist is applied over the total surface of the integrated optical circuit. A mask pattern is now provided whereby the pattern for the fabrication of the directional-coupler is performed. To this end, reference is made to FIGS. 1, 5, 6 and 7. In the fabrication of the electro-optic channel-waveguide modulator, a Schottky barrier comprising a single narrow strip of deposited platinum is provided on top of the semiconductor structure 8. A contact pad 44 is also provided thereon. In the fabrication of the electro-optic directional-coupler switch, three parallel Schottky barrier strips are provided for of platinum on top of the semiconductor structure 10 by means of electroplating. A contact pad 54 is also provided thereon. The final passive optical device comprising a directional-coupler is fabricated by the deposition of the three metallized strips 50 which may comprise Schottky barriers on top of the semiconductor structure 12. This now completes the fabrication of the integrated optical circuit as shown in FIG. 1.

The alignment and attachment of an optical fiber to a waveguide structure is another area of difficulty in an integrated optical circuit. Attachment of the optical fiber to the waveguide may be achieved by cleaving the waveguide and butting the end of the fiber up against the cleaved end of the waveguide ridge 26 in FIG. 1. An alternative method is to fabricate a structure which would have the end of the waveguide terminate in an I-bar shape with a planar perpendicular facet to the substrate. The end of the optical fiber could be butted up against the end facet and epoxied into place. An etched groove in the substrate could aid in the alignment process.

The I-bar end waveguide structure comprises a semiconductor mesa having an elongated central member and a cross bar at one end thereof and perpendicular to the axis of said elongated central member as indicated in FIG. 3.

The I-bar end waveguide is fabricated by the technique described above for the fabrication of the waveguide structure itself. In this respect, a pattern opening is fabricated in the mask having the I-bar end structure depicted therein. It is only required that the mask be oriented so that the face of the I-bar end is oriented along a {100} crystallographic plane.

The integrated optical circuit as indicated in FIG. 1 represents only one particular embodiment that may be fabricated by the method of the present invention. In particular, the circuit shows active and passive optical devices comprising a modulator, a switch, and coupler integrated by means of optical waveguides wherein light is propagated by means of an end fired I-bar mesa laser. However, it should be clear to one skilled in the art that other active and passive components may be utilized in addition to other arcuate optical waveguide structures and assembled in different relationships. Also, the I-bar mesa laser may be fabricated first followed by the active optical devices and their interconnecting waveguides. An additional method of coupling light from the I-bar mesa laser in the integrated optical circuit is to epitaxially grow the I-bar mesa laser on top of an optical waveguide portion and provide evanescent field coupling therebetween.

While particular embodiments of this invention have been disclosed herein, it will be understood that various modifications may become apparent to those skilled in the art without departing from the spirit and scope of the invention which is defined by the appended claims.

What is claimed is:

1. A method of fabricating a monolithic integrated optical circuit comprising:

fabricating a multi-layer continuous waveguide structure on the planar surface of a semiconductor substrate, said waveguide structure having planar open areas for the subsequent fabrication of electro-optic devices therefrom, one of said layers capable of propagating light therethrough;

fabricating a light emitting device on at least one of the above listed members in such a relationship to the waveguide structure so as to transmit light thereto;

depositing contact means upon the opposite parallel face to said planar surface of said semiconductor substrate and upon a portion of said light emitting device; and fabricating said electro-optic devices by depositing metal patterns on top of said planar open areas.

2. A method of fabricating a three dimensional integrated optical circuit having two dimensional confinement comprising the steps of:

fabricating a continuous patterned opening in a mask on a planar surface of a semiconductor substrate defining open areas for the fabrication therethrough of active and passive electro-optic devices and interconnecting waveguide structure;

depositing a first continuous semiconductor layer having a first index of refraction onto said planar surface through said patterned opening;

depositing a second continuous semiconductor layer having a second index of refraction higher than said first index onto said first semiconductor layer, said second layer defining a light propagating layer;

fabricating a light emitting device on at least one of the above listed members in such a relationship to the waveguide structure so as to transmit light thereto;

depositing contact means upon the opposite parallel face to said planar surface of said semiconductor substrate and upon a portion of said light emitting device; and depositing metal patterns on top of said second semiconductor layer in the fabrication of said electro-optic devices.

3. A method of fabricating a three dimensional integrated optical circuit by liquid phase epitaxy have two dimensional confinement comprising the steps of:

depositing a mask onto the planar surface of a Group III-V semiconductor substrate;

removing a portion of said mask to form a continuous pattern opening therein defined by open areas for the location of active and passive electro-optic devices to be fabricated on said substrate including interconnecting waveguide structure;

growing a first continuous semiconductor layer of $Ga_{1-x}Al_xAs$ having a first index of refraction onto said planar surface through said pattern openings;

growing a second continuous semiconductor layer of $Ga_{1-y}Al_yAs$ on top of said first layer, said second layer having an index of refraction higher than said first layer, said second layer defining a light propagation layer;

fabricating a laser light emitting device on at least one of the above listed members in such a relationship to the waveguide structure so as to transmit light thereto, metallizing contact means upon the opposite parallel face to said planar surface of said semiconductor substrate and upon a portion of said light emitting device; and depositing metal patterns on top of said second semiconductor layer in the fabrication of said electro-optic devices.

* * * * *